United States Patent
Kilbank (10) Patent No.: US 7,408,486 B2
(45) Date of Patent: *Aug. 5, 2008

(54) SYSTEM AND METHOD FOR USING A MICROLET-BASED MODEM

(75) Inventor: Daniel Kilbank, Potomac, MD (US)

(73) Assignee: Qbit Corporation, Gaithersberg, MD (US)

( * ) Notice: Subject to any disclaimer, the term of this patent is extended or adjusted under 35 U.S.C. 154(b) by 246 days.

This patent is subject to a terminal disclaimer.

(21) Appl. No.: 10/828,243

(22) Filed: Apr. 21, 2004

(65) Prior Publication Data

US 2004/0207548 A1    Oct. 21, 2004

Related U.S. Application Data

(60) Provisional application No. 60/464,095, filed on Apr. 21, 2003.

(51) Int. Cl.
   *H03M 7/00* (2006.01)
(52) U.S. Cl. .......................... 341/107; 341/50
(58) Field of Classification Search ......... 341/105–130, 341/155, 143–144, 50–90
   See application file for complete search history.

(56) References Cited

U.S. PATENT DOCUMENTS

| | | | |
|---|---|---|---|
| 3,784,832 A | 1/1974 | Sewell | |
| 4,567,383 A | 1/1986 | Goto et al. | |
| 4,879,488 A | 11/1989 | Silver | |
| 4,890,282 A | 12/1989 | Lambert et al. | |
| 5,182,642 A | 1/1993 | Gersdorff et al. | |
| 5,398,030 A | 3/1995 | Sandell | |
| 5,787,236 A | 7/1998 | Tucci | |
| 5,912,636 A * | 6/1999 | Gormish et al. | 341/50 |
| 5,917,322 A | 6/1999 | Gershenfeld et al. | |
| 5,917,943 A | 6/1999 | Washizawa | |
| 5,942,765 A | 8/1999 | Miyahara et al. | |
| 6,006,105 A | 12/1999 | Rostoker et al. | |
| 6,037,985 A | 3/2000 | Wong | |
| 6,058,211 A | 5/2000 | Bormans et al. | |
| 6,084,908 A | 7/2000 | Chiang et al. | |
| 6,128,764 A | 10/2000 | Gottesman | |
| 6,184,681 B1 | 2/2001 | Heidler et al. | |
| 6,195,465 B1 | 2/2001 | Zandi et al. | |
| RE37,222 E | 6/2001 | Yonemitsu et al. | |
| 6,243,496 B1 | 6/2001 | Wilkinson | |
| 6,246,430 B1 | 6/2001 | Peters et al. | |
| 6,246,799 B1 | 6/2001 | Ebisawa | |
| 6,298,160 B1 * | 10/2001 | Goertzen | 341/107 |
| 6,456,994 B1 | 9/2002 | Tucci | |
| 6,472,681 B1 | 10/2002 | Kane | |
| 6,580,833 B2 * | 6/2003 | Goertzen | 341/50 |
| 6,756,925 B1 | 6/2004 | Leung et al. | |
| 6,778,965 B1 * | 8/2004 | Bruekers et al. | 341/51 |
| 6,943,710 B2 * | 9/2005 | Marpe et al. | 341/107 |
| 6,947,913 B1 * | 9/2005 | Lawrence | 706/14 |

(Continued)

*Primary Examiner*—Lam T Mai
(74) *Attorney, Agent, or Firm*—Gottlieb Rackman & Reisman, PC (57) ABSTRACT

A modem architecture and applicable method use microlet transforms to encode and exchange data or information. An encoder determines the probability states of a quantum representation, and uses the states to represent data in lossless manner. A block of data is reduced to a smaller size of data by the encoding, in some instances, to single bit. The encoder can be used in conjunction with existing networks and infrastructure.

11 Claims, 4 Drawing Sheets

U.S. PATENT DOCUMENTS

| | | |
|---|---|---|
| 2001/0025012 A1 | 9/2001 | Tarutani et al. |
| 2002/0106084 A1 | 8/2002 | Azuma et al. |
| 2002/0139932 A1 | 10/2002 | Lofts |
| 2002/0181593 A1 | 12/2002 | Acharya et al. |
| 2003/0093451 A1 | 5/2003 | Chuang et al. |
| 2004/0002670 A1 | 1/2004 | Mothersbaugh et al. |
| 2004/0044940 A1 * | 3/2004 | Lawrence et al. ........... 714/746 |
| 2004/0052373 A1 | 3/2004 | Debuisschert |
| 2004/0057526 A1 | 3/2004 | Debuisschert |

* cited by examiner

SYSTEM AND METHOD FOR USING A MICROLET-BASED MODEM

CROSS REFERENCE TO RELATED APPLICATIONS

This application claims priority of Provisional Application Ser. No. 60/464,095, entitled, "System and Method for Using a Microlet-Based Modem," filed Apr. 21, 2003, the entire contents of which are incorporated herein by reference.

BACKGROUND OF THE INVENTION

1. Field of the Invention

The present invention relates to encoding and transmitting information over a network, and, more particularly, systems and methods for transmitting blocks of data with lossless encoding over a network using a modem architecture and having increased representation of the original data with improved transmissability.

2. Description of the Related Art

Communication systems and networks are undergoing a trend towards flexible receivers and more robust, dependable and scalable communication solutions. Users on a network require increasing amounts of information and data to be delivered in a timely and real-time manner. Many solutions, such as broadband or digital subscriber lines, improve information delivery over conventional telephone networks. Cable systems also are able to deliver high speed information exchange. Generally, a modem is used to transmit the information as an analog signal from one location to another. Dial-up services are limited by various constraints, such as the modem architecture or network infrastructure. Broadband solutions seek to improve over these systems by using new modems and/or different architectures. These solutions, however, may be costly or have other obstacles such as additional equipment, new accounts, and a loss of service in certain areas.

Another solution to increase data delivery is compressing data according to known compression algorithms. Data compression is well known and many standards exist that define processes for compressing data to be more suitable for transmitting as an analog signal over existing networks. One potential drawback of compression is the possibility of losing data, first when compressing the data from a certain size to a smaller size of data, and second, when decompressing the data back to its original size. The compression algorithm "loses" that data which it determines is not essential or needed in effectively displaying or transmitting the information. In certain instances, this loss of data may be critical or overreaching.

As additional demands are placed on the transmission and the storage of information and data, compression algorithms are becoming increasingly less efficient or practical in representing large data files, such as movies, as it is being transmitted over the network. Too much data is being lost or misrepresented to a user or other entity on the delivery side of a network. Further, as businesses become more reliant and familiar with electronic documents and other aspects of electronic storage, resources are being used to store data, documents, files and the like at additional cost and without any practical solution for storing additional files or data in the future. For example, the business may generate e-reports or newsletters to send to potential clients and customers. As the weeks, months and years go by, the storage of these newsletters may become a critical factor of the size of the newsletters and how long the newsletters are retained. As the newsletters attempt to keep up with competitors, the company may add digital photos, video files, charts, data and the like to the newsletters to provide more information to readers. These features require larger files for each newsletter and additional storage space to retain newsletter records. Presently, the only solution in transmitting and storing data is to buy increasing amounts of memory or buffer space, and to improve transmission network infrastructure to handle the larger files. These solutions mean additional costs to the company and additional equipment needs.

SUMMARY OF THE INVENTION

According to the disclosed embodiments, a method for encoding data is disclosed. The method includes determining a probability state of a quantum representation. The method also includes encoding a set of bits with the probability state of the quantum representation.

Thus, methods and systems of encoding information and transmitting the encoded information over a network or medium are disclosed. The information is encoded as disclosed above, and the signal is a lossless representation of the data. For example, the present invention may be applicable to storage of data such as a tape drive or a hard disc drive using sub-atomic particle, atomic or nanometer level of size, nanomachine, analog or digital, magnetic or optical, tape, floppy, compact disc, digital video disc or other means of storage. The present invention may be used for video or audio or data or text storage and may be implemented or used in conjunction with a random access memory or read only memory. The present invention also may be applicable to any disc drive or compact disc drive in that data is encoded according to the disclosed embodiments and then provided to these drives as a lossless representation of the original data. The disclosed embodiments also may receive data from a video source, such as a VCR, audio tape, eight-track tape, phonograph, optical film or the like and encode this data into a digital format to be saved in the applicable storage medium. The drive according to the disclosed embodiments may be interpreted as any player recorder or combination thereof for audios, video or data. Embedded storage devices or detachable storage devices that are attachable via pins, printer cables, universal serial bus, file wire, or any other connection also may be used in conjunction with the disclosed embodiments.

The disclosed embodiments also may be used in conjunction with consumer electronics and hardware, such as a personal computer, a desktop computer, a notebook/laptop computer, a server, a mainframe, any consumer or business application/appliances such as a toaster, refrigerator, coffee maker, stove, freezer, trash compactor, wine cooler, furnace, water heater, air conditioner/temperature control system, pool, Jacuzzi/hot tub, septic/sewer system, electric/oil/gas system, water system, HVAC/water/steam/hydraulic system, street traffic system, reference/guidance/air traffic control/radar/water or road navigation/feet monitoring/GPS system/lighting system/security system, sprinkler/fire suppression system, any video conferencing, a tape player/walkman, a digital disc player/minidisk/I-pod/small hard drive disc player, a flash memory player, a television, a stereo, a store image camera, a camcorder, a motion picture camera, a projector, a slide projector, an electronic white board, and the like.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

Reference is now made to the above-disclosed figures to illustrate exemplary embodiments of the present invention. The exemplary embodiments are disclosed in greater detail according to this detailed description and to the appended drawings wherein like numerals designate like elements.

Figure 1:
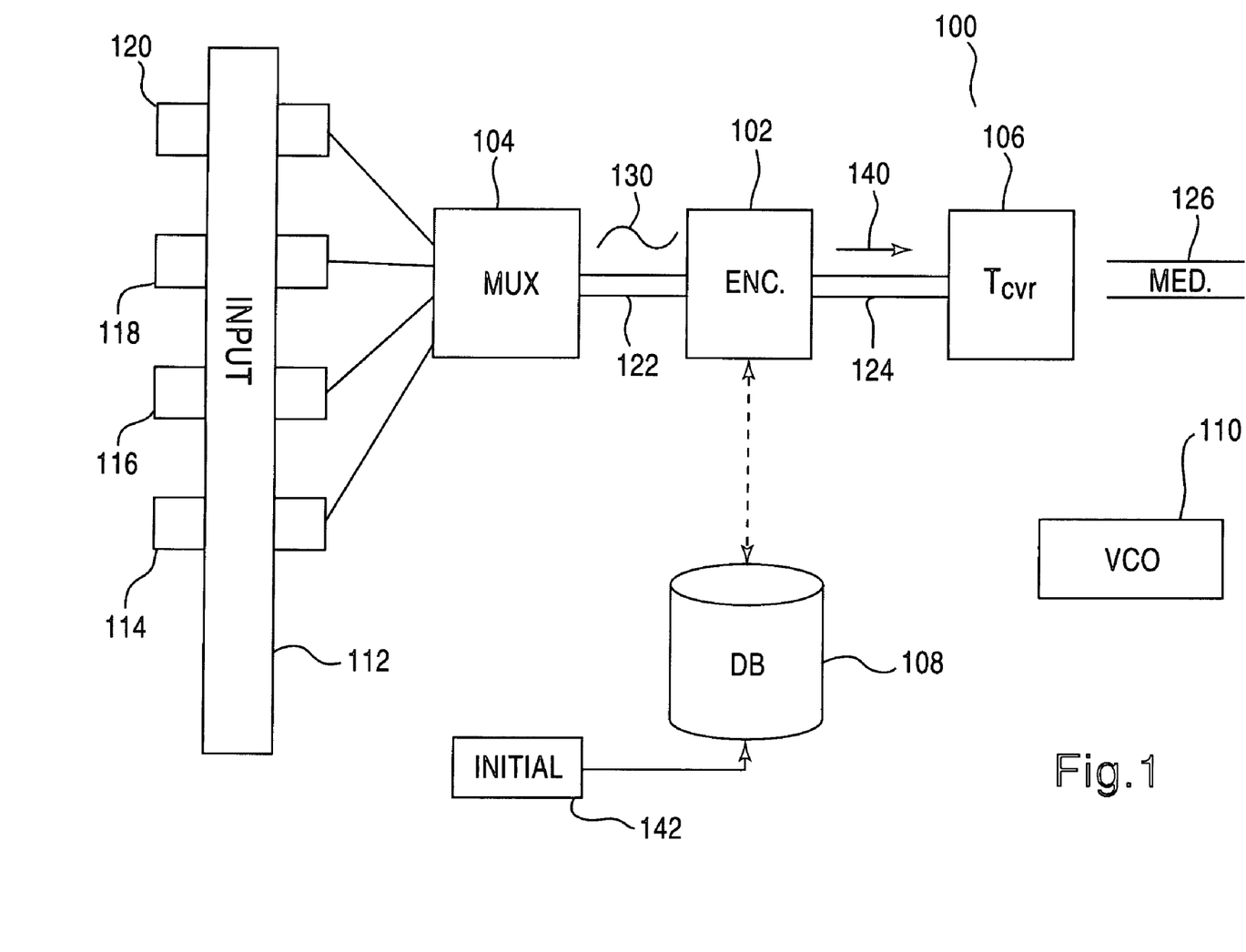
FIG. 1 illustrates a block diagram of a modem architecture according to the disclosed embodiments.

FIG. 1 illustrates a block diagram of a modem architecture 100 according to the preferred embodiments. Modem architecture 100 may be implemented in any existing or future modems that are used to transmit signals over a network. Modem architecture 100 may include encoder 102, multiplexer 104, and transceiver 106. Transceiver 106 may exchange signals, data packets, optical signals, audio, video and the like across transmission medium 126. Transceiver 106 and transmission medium 126 may be any known communication exchange system. For example, transceiver 106 may be an antenna in a wireless portable device and transmission medium 106 may be air or space. Transceiver 106 may be coupled to a communications network that receives and transmits information from various locations. Modem architecture 100 may be configured to operate in conjunction with the network supporting transmission medium 126.

Oscillating circuit 110 and database 108 are accessible by modem architecture 100. For example, database 108 and oscillating circuit 110 may be within modem architecture 100 and supporting client side operations to receive and transmit information over a network. If transceiver 106 is an antenna, database 108 and oscillating circuit 110 facilitates the reception and transmission of signals and other information. Alternatively, database 108 or oscillating circuit 110 may be separate components coupled to modem architecture 100. Database 108 may be provided on the network and coupled to modem architecture 100 via network connections. Database 108 stores information, or blocks of data, that is used by modem architecture 100 and encoding signals and other information prior to transmission from transceiver 106. Preferably, database 108 is referred to as an intelligent database because database 108 may catalog and update itself in a dynamic fashion with new encoded information.

Input 112 includes input ports 114, 116, 118 and 120. Input 112 is coupled to multiplexer 104 and provides various data signals or blocks of data to multiplexer 104. The data and information provided by input ports 114, 116, 118 and 120 does not necessarily have to be in an identical format or type. For example, input port 114 may input audio or voice signals/data to multiplexer 104. Input port 116 may provide video or photo optic signals/data to multiplexer 104. Input port 118 may provide a compressed signal from an attached compression algorithm to multiplexer 104. Input port 120 may provide an encrypted software program to be transmitted to modem architecture 100. Input 112 is not limited to the configuration illustrated in FIG. 1, and may include any number of input ports to receive any number of data streams. Input ports 114-120 may be virtual ports that are created and decimated by modem architecture 100 as required. Alternatively, input ports 114-120 may include hardware configurations to connect modem architecture 100 with the data streams from other devices, modules or components.

Multiplexer 104 multiplexes the received signals from input 112. Multiplexer 104 may operate as any known multiplexer and may sample the received signals according to oscillating circuit 110. The signals are combined by multiplexer 104 to generate signal 130. Signal 130 may include blocks of data representing the different signals received by multiplexer 104. Signal 130 may be an analog or digital signal capable of carrying information or data over coupling 122.

Transceiver 106 may transmit the information and data in signal 140. As disclosed above, transceiver 106 may transmit information as a signal, data packets, optical signal and the like. Transceiver 106 also may be coupled to oscillating circuit 110 to transmit and receive at specified frequencies. Oscillating circuit 110 may be a phase locked loop circuit or a plurality of phase locked loop circuits that provide the specified frequencies to components in modem architecture 100.

Encoder 102 may access database 108. Database 108 is an intelligent database that may reside either on a network or client, or both, to record and catalog data for encoding, compression and sine representations for subsequent or further analysis. Database 108 features part of the original compression technology and the data produced by encoder 102 as well as capturing and turning new information for association and the ability to expedite the use of database 108 and other applications. Database 108 allows for quicker affine characters to be produced as program characters for situations already encoded or cataloged. This ability may be especially critical for motion in media encoding. Database 108 may permit catalog storage and reference information of all normalized data traffic through modem architecture 100. Database 108 learns patterns and color/movement/similarities in real-time video so that subsequent encoding operations are made quicker by encoder 102 accessing database 108. Database 108 also may store the tagged portions or "designations" of data representations received from encoder 102, thus ultimately reducing further amounts of processing.

Encoder 102 may encode signal 130 into encoded signal 140 according to processes disclosed below. Encoder 102, however, may enable more widths per cycle to be represented in signal 140 and operates in the optimal space between the peak stop band attenuations of wavelet technologies. Encoder 102 implements lossless compression or encoding to reduce bandwidth for the same amount of information. For example, the informational data in signal 130 is compressed or encoded without losing any of the original informational data into encoded signal 140. This feature increases the speed of the data being delivered over transmission medium 126 in its corresponding network. Encoder 102 also may map the lossless encoding or compression to current protocols to be applicable for all communication applications from plain old telephone systems through optical/dark fiber, satellite, and wireless applications. Further, encoder 102 is frequency transparent in that it is transparent to network infrastructure by producing size per bands and bandwidth utilization and speed.

Modem architecture 100 may be microlet-based in that its encoding and exchanging of information and data uses microlets. A microlet may be defined in a Banach/Hilbert vector space. This principle may be used because it defines both the Hilbert space properties as well as allowing for expansion into a Banach space. It may be stated that a Hilbert space is always a Banach space, but the converse may not hold. A microlet may be defined as a four dimensional maximize wavelet packet analyzer that shares similar characteristics to wavelets and Fast Fourier Transforms in capabilities and function, but is not limited to their dimensional and mathematic constraints. A microlet may be defined as a hybrid wavelet that carries the portability of discreet waveform transform with more complex detailing power than a two-dimensional wavelet packet analyzer. A microlet may perform the same transform of all legacy wavelet technologies and the faster technologies like adaptive wave packet transfer and discreet periodic wavelet transform. The multi-dimensions of the microlet in its vector space allows for a great deal of latitude. For example, signal coordinates or data coordinates may represent information that is defined in a matrix space. Techniques like parallel decomposition and four-dimensional packet analysis lack the greater detail, range of motion and other fine/course details to be included on a single waveform, such as encoded signal 140. The complexity of mapping signal 130 to encoded signal 140 may be reduced by the disclosed embodiments.

The disclosed embodiments may use the space between the baseband modulation operators that provide the coordinate transformation to rotate data into a signal, such as encoded signal 140. Transceiver 106 may send compressed, coefficient, tagged data, signed and co-signed waveforms over transmission medium 126, as well as digital information. Overlapping microlets in these waveforms may replace packets in the layer. A microlet may be a non-binary code that can overlap in time and frequency without interference due to cross-correlation properties of waveforms, similar to wavelet technologies. Thus, modem architecture 100 allows for a waveform to carry compressed information that is both compressed and related to modem architecture 100 and to an outside compression technology. For example, referring back to input 112, data port 120 may receive information or data that has already been compressed according to a known compression algorithm. In the example, input port 120 may receive an MPEG file, having video and audio components. Multiplexer 104 samples the MPEG file from input port 120 and provides signal 130. Signal 130 is encoded by encoder 102 according to the disclosed embodiments. Thus, encoded signal 140 includes the compressed MPEG data that is also encoded into encoded signal 140.

Wavelet mathematics may be known in the fields of imaging and compression. The disclosed embodiments disclose a modem architecture 100 that may create a smaller and more robust waveform than known wavelet processes. Using baseband encoding and decoding, side-band encoding/decoding and producing heterodyne conversions via oscillating circuit 110, encoder 102 may use compression and tools to allocate information to various sub-bands and frequencies. The disclosed embodiments allow tagged information like packet voice, video on demand and data in a bundled package inside of microlets to reach a destination through transmission medium 126. The implementation may be transparent to all media. Further, modem architecture 100 may address the last mile question in that it has applicability to existing networks including synchronous optical network carriers.

Database 108 may be initialized by initialization data information 142. Initialization data or information 142 may include encoded data information already represented in the microlet format. Database 108, alternatively, may not include any initialization data information 142. Upon receiving signal 130, encoder 102 may access database 108 to search for matches of data represented by signal 130. The data stored in database 108 is already in an encoded format such that a block of data from signal 130 corresponds to a block of data in database 108. The block of data, or encoded block, within database 108 is smaller than its corresponding block of data in signal 130. The encoded block of data in database 108, however, includes all the information, such as bits, but represents the block of data in signal 130.

Figure 2:
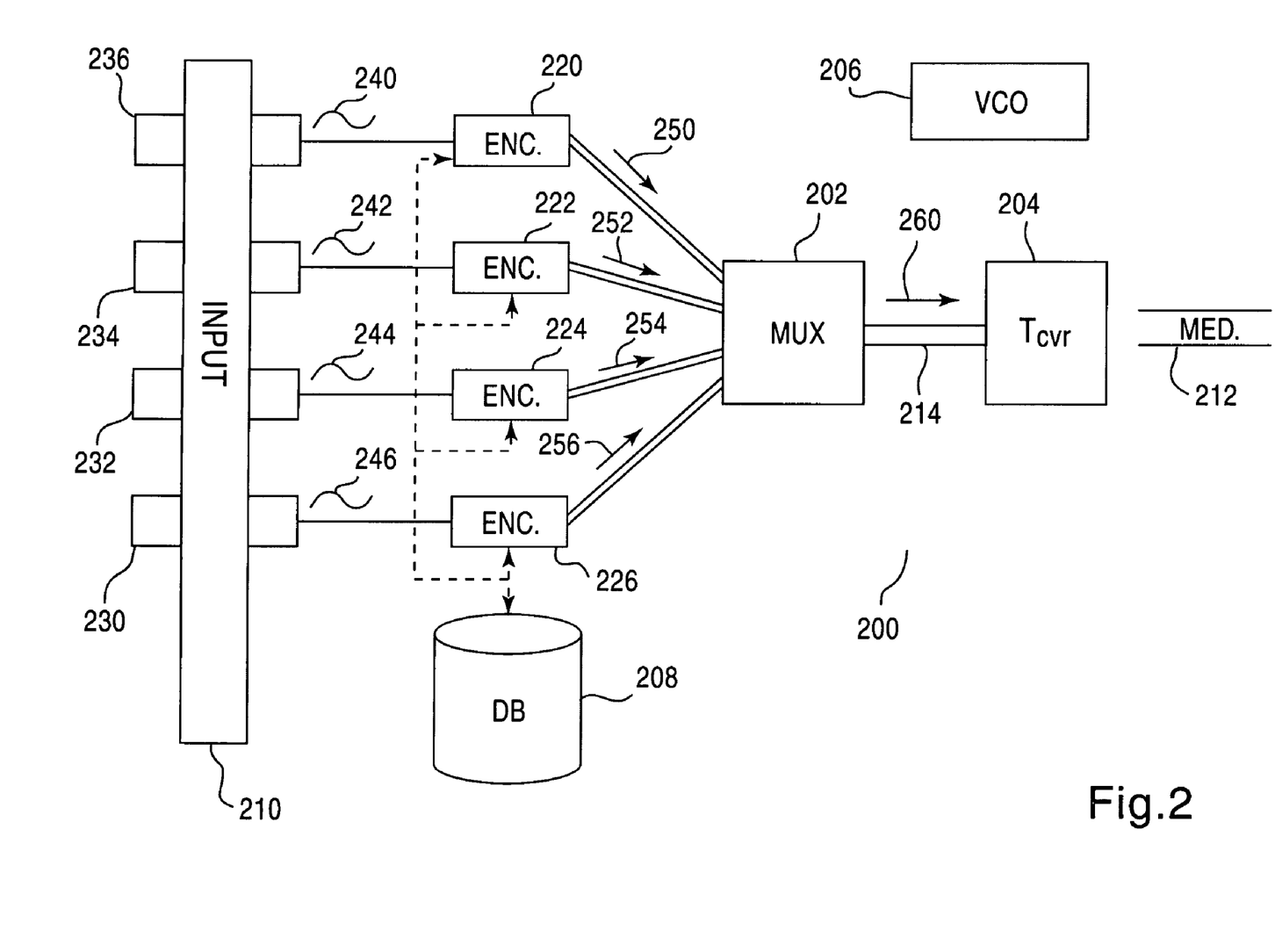
FIG. 2 illustrates another block diagram of a modem architecture according to the disclosed embodiments.

FIG. 2 illustrates a block diagram of another modem architecture 200 using database 208 according to the preferred embodiments. Modem architecture 200 is similar to modem architecture 100, as shown above. Modem architecture 200, however, does not limit the disclosure of FIG. 1.

Modem architecture 200 includes multiplexer 202 and transceiver 204. Transceiver 204 may transmit and receive signals, waveforms, packets of data, optical signals and the like over transmission medium 212. Multiplexer 202 and transceiver 204 are coupled by connector 214. Oscillating circuit 206 may provide reference frequencies to components within modem architecture 200. For example, oscillating circuit 206 may provide reference frequencies to transceiver 204. Oscillating circuit 206 also may provide a plurality of reference frequencies using phase locked loop circuits.

Modem architecture 200 includes encoders 220, 222, 224 and 226. Encoders 220-226 may be similar to encoder 102, as disclosed with reference to FIG. 1. Encoders 220-226 provide encoded signals to multiplexer 202. Multiplexer 202 then samples each encoded signal to provide a single encoded signal 260 to transceiver 204. Signal 260 may represent all the encoded signals multiplexed by multiplexer 202. Encoded signal 260 may be transmitted by transceiver 204 at a specified frequency over transmission medium 212.

Input 210 includes input ports 230, 232, 234 and 236. Each input port provides a signal to an encoder. According to the disclosed embodiments, input ports 230, 232, 234 and 236 provide signals 246, 244, 242 and 240 to encoders 226, 224, 222 and 220, respectively. As with input ports 114, 116, 118 and 120 disclosed with reference to FIG. 1, input ports 230, 232, 234 and 236 may receive a variety of data formats such as analog, digital, video, audio, optical, compressed data, text, code and the like. Encoders 220, 222, 224 and 226 may be tailored to those specific formats. For example, if input port 236 receives input signal 240 as a MPEG file, the encoder 220 may be tailored or configured to encode MPEG files.

Database 208 is accessible by encoders 220, 222, 224 and 226. As with database 108 of FIG. 1, database 208 is an intelligent database that can store, update and catalog and record encoded and compressed data and signed representations for analysis and use by encoders 220-226. Encoder 220 may access blocks in the specified memory location, that may be separate from other memory locations correlating to other encoders. Encoders 220-226 encode signals 240-246 from large blocks of data into small blocks or even a bit of data within encoded signals 250-256. According to the disclosed embodiments, the bits in encoded signals 250-256 represent data in a quantum state. For example, the quantum numbers of an electron may represent data to increase the scalability of a single bit from binary representations to quantum representations. Further, encoders 220-226 encode in a lossless environment such that no data or information from signals 240-246 is lost during encoding. Thus, signal 260 is transmitted by transceiver 204 without any loss of data from the incoming signals at input 210.

As noted in FIG. 2, database 208 may be accessible individually by encoders 220-226. Alternatively, a subset of encoders may only access database 208. For example, encoder 222 may not access database 208 for security reasons or compatibility issues. Encoders 220, 224 and 226, however, may access database 208.

Figure 3:
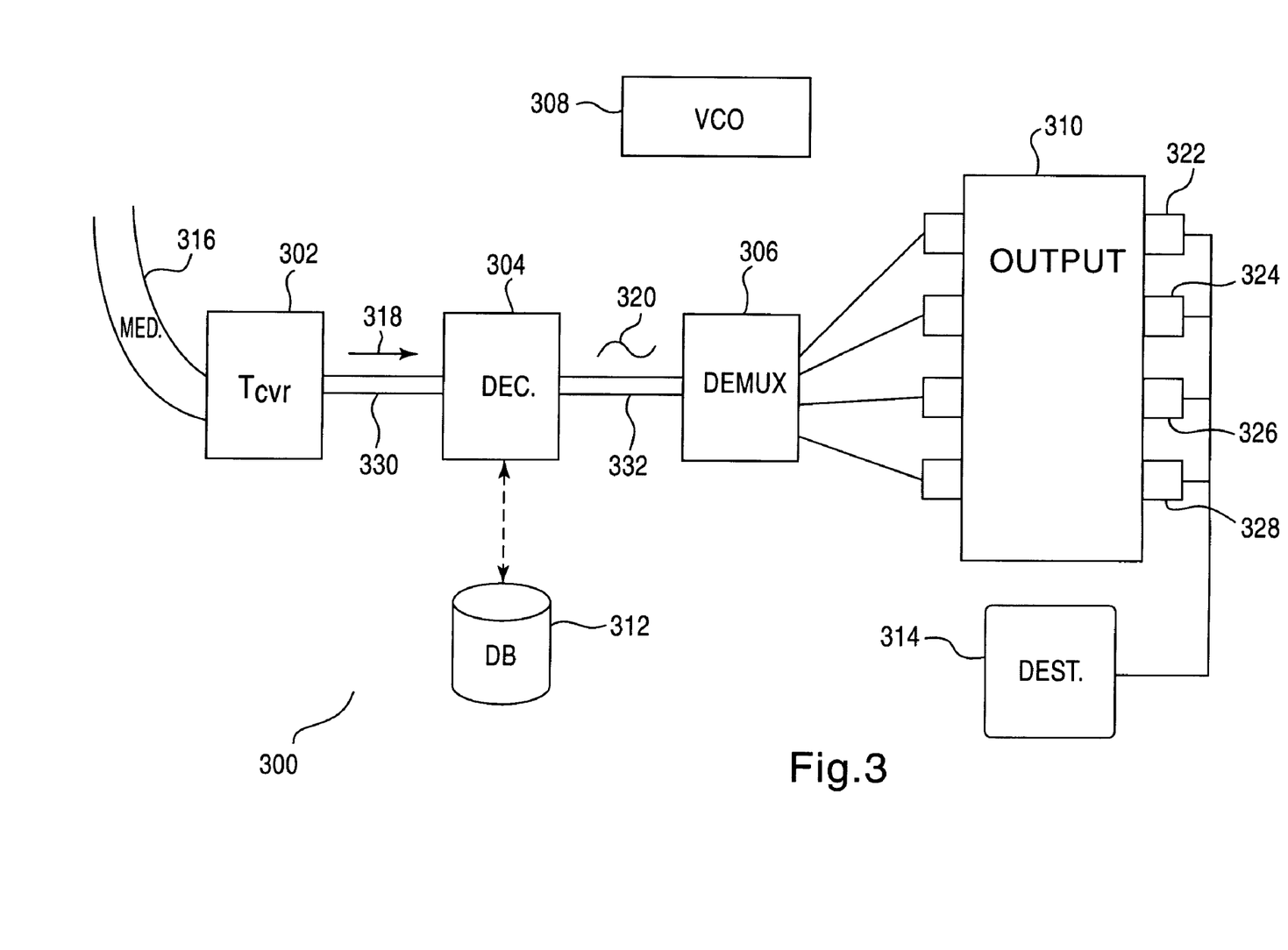
FIG. 3 illustrates another block diagram of a modem architecture according to the disclosed embodiments.

FIG. 3 illustrates a block diagram of another modem architecture 300 using database 312 according to the preferred embodiments. Modem architecture 300 includes transceiver 302, decoder 304, and demultiplexer 306. Modem architecture 300 is shown configured to receive and decode a signal, data packet, waveform, optical signal and the like back to its original representation. Modem architecture 300 may be used in conjunction with other modem architectures such as modem architectures 100 and 200, that transmit information. Modem architecture 300 receives information and data over transmission medium 316 that is coupled to a network. Modem architecture 300 may convert an analog signal transmitted over the network coupled to transmission medium 316 to its original representation including a digital signal.

Transceiver 302 receives encoded signal 318. Encoded signal 318 may include blocks of data or data packets that have been encoded according to an encoding process, as disclosed above. Within encoded signal 318, a header or other data attachment may include the encoding algorithm or basis that is received by decoder 304. Using this information, decoder 304 may decode the data information in encoded signal 318 back to original signal 320. The decoding process may include mapping the bits or data of encoded signal 318 back to blocks of data in original signal 320. The blocks of data for original signal 320 may be represented, or mapped to encoded signal 318.

Decoder 304 may use a received algorithm or coding process to decode or remove the information in the quantum states of the bits in encoded signal 318. Thus, data information represented in binary form of original signal 320 may be represented according to quantum numbers of data within encoded signal 318. The decoding process may be a lossless process in that all of the encoded information of encoded signal 318 is reconstructed in original signal. For example, if original signal 320 correlates to signal 130 of FIG. 1, signal 320 may include all of the data and information comprising signal 130.

Decoder 304 accesses database 312 in reconstructing original signal 320. Database 312, in addition to storing encoded blocks of data representing the quantum numbers of various data representations, also may store the data representations corresponding to blocks of encoded data. Thus, decoder 304 may convert the encoded data in encoded signal 318. Demultiplexer 306 demultiplexes original signal 320 to output 310.

Output 310 includes output ports 322, 324, 326 and 328. The signals received by output ports 322-328 may be exact representations of the corresponding input signals that were encoded into encoded signal 318. Output ports 322-328 may be coupled to destination 314. Destination 314 may include a display, a computer, a memory location, a disk or other data storage means, and the like. For example, destination 314 may be a screen attached to a computer for viewing MPEG files. A user may watch the files in real time on the screen, without any delay or loss of information. In another example, encoded signal 318 may derive from a live video conference, wherein a user is viewing and talking in real time with another user in a different location. Destination 314 may be the screen to display the video conference. According to the disclosed embodiments, the video is displayed without any loss of data and without any noticeable delay. A modem may connect destination 314 to transmission medium 316.

Figure 4:
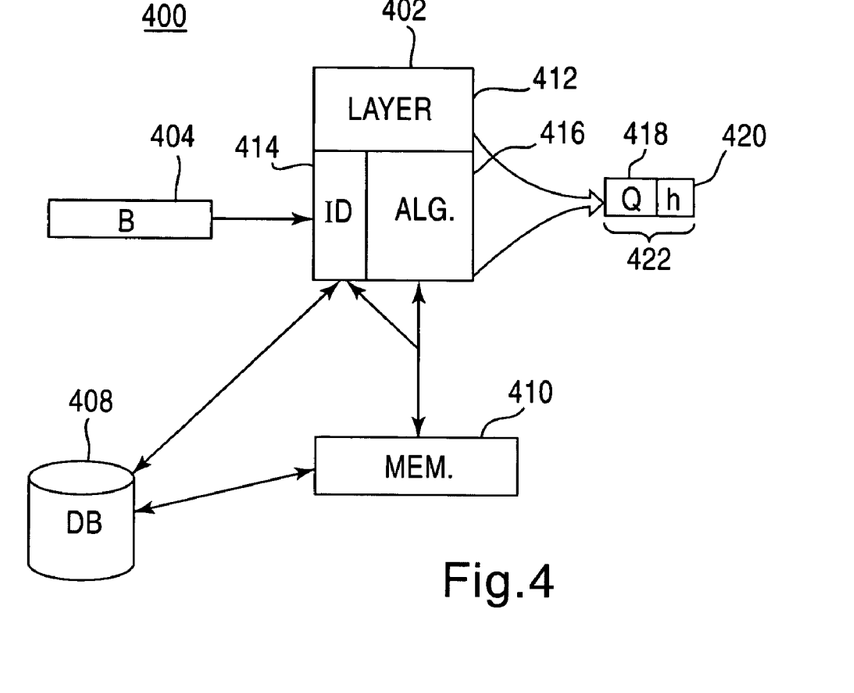
FIG. 4 illustrates an encoder according to the disclosed embodiments.

FIG. 4 depicts an encoder 400 according to the disclosed embodiments. Encoder 400 may receive data block 404. Data block 404 may be a set of bits to be encoded into encoded data block 422. Encoder 400 includes encoding module 402 having a layer 412, identification block 414 and algorithm component 416. Encoding module 402 may access memory 410, which may be a virtual quantum register, a look up table, and the like. Encoding module 402 also may access database 408.

Encoder 400 may implement microlets, microlet transforms, and quantum representations, such as electrons, to encode data block 404 in a lossless manner and to a much reduced size. These features enable encoder 400, and any resulting modem architecture, to exchange information and data in a real time and efficient manner without losing any of the data to compression algorithms, packet analysis, or other constraints from network infrastructure.

Encoder 400 may relate to multi-state binary encoding that enables lossless storage and transmission over networks for all kinds of high definition media, data and information. The disclosed embodiments may be referred to as a disruptive technology that combines quantum theory physics and information theory. Encoder 400 may use computational simulations, such as algorithm component 416, that behave according to quantum theory principles despite running on classical hardware, systems, networks and the like. Thus, by predicting an understanding of quantum behavior at the particle structure level, encoder 400 may encode data with lossless mapping such that large blocks of data may be transmitted or exchanged. Encoder 400 may encode and map data because every quantum system has a set of mathematical rules that describe the dynamics and total energy of the system in terms of the motion of all of its components. Thus, by determining the probabilities of various energy states within quantum representations, such as an electron, the disclosed embodiments may set values according to these probabilities.

A single electron, or quantum representation, may travel exponentially along many different routes in a simultaneous manner. Further, quantum systems may exhibit correlations between states within super positions, or the entangled particles concept. Thus, quantum information may exist as a linear super position of two classical states, such as 1 or 0, at the same time. According to the disclosed embodiments, qubits, or quantum bits, such as qubit 418, may be homomorphic in that they can transform from one state to another without losing data in the second state. As new qubits are added, the number of states doubles. Thus, a small number of qubits may represent a large number of possibilities, within encoded data such as encoded data block 422. According to the disclosed embodiments, qubit registers may hold super positions of states and by varying amplitude at two states, encoder 400 using algorithm component 416 may create an infinite number of different super positions.

The disclosed embodiments implement probability mathematics that may be used to isolate regions within a Hilbert-Banach, or HB, space (also may be known as a Banach/Hilbert space) to a small, finite set of possibilities that allow the practical utilization of computational simulations on known hardware, network, and software systems. Computational simulations may behave at the particle structure level according to quantum theory, such that the amount of information that may be contained on a virtual electron, or quantum representation, is at least 32 times greater than known technology. Layer 412 should include the encoding layer to represent the states of the virtual electron.

The disclosed embodiments operate entirely at the binary level using zeros and ones. Further, the disclosed embodiments may be implemented by software or other means that is compatible with existing hardware and network components. Encoder 400 may be a microlet based system that enables an increased bits-per-cycle and operates in the optimal space between the peak stop band attenuations of wavelet technologies. Encoder 400 may perform digital signal processing, frequency modulation, frequency phase and phase amplitude vector modulation for wired and wireless communications. Encoder 400 may be applicable for all communication applications from existing telephone systems through optical/dark fiber, satellite, wireless and the like. Moreover, encoder 400 may be frequency transparent through layer 412 in that it is transparent to network infrastructure while increasing transmission gain and delivery.

A microlet, as disclosed above, may be defined in an HB vector space. This principle is used because it necessarily defines both the Hilbert properties as well as allowing for expansion into a Banach space. Thus, encoding module 402 may define a vector space. A microlet may be a four-dimensional maximized wavelet packet analyzer sharing similar characteristics to wavelets and fast forward transforms and capabilities and functions, but is not limited to the dimensional or mathematic constraints of wavelets. A microlet may perform the same transforms of all the wavelet technologies, and more advanced techniques such as adaptive wave packet transfer and discreet periodic wavelet transform. Microlets may use energy state probabilities of the quantum representations, such as electrons, as disclosed above. Encoder 400 may implement techniques like parallel decomposition and four-dimensional packet analysis to allow for greater detail, range of motion and other fine/course details that may be included on a single waveform, such as encoded signal 140, as shown in FIG. 1.

Encoder 400 and encoding module 402 may map data block 404 onto encoded data block 422 using a mapping function within algorithm component 416. The disclosed embodiments may use the space between the base band modulation operators to provide the coordinate transformation to rotate data into a signal having encoded data block 422. A transceiver coupled to encoder 400, such as transceiver 106 in FIG. 1, may send compressed, coefficient, tagged data signed and cosigned with waveforms, digital information and the like over most infrastructures replacing packets in a layer of overlapping microlets.

Like wavelet technology, a microlet according to the disclosed embodiments may be a non-binary code that can overlap in time and frequency without interference due to the cross-correlation properties of waveforms. This feature allows for a waveform to carry compressed information that is both compression related to encoder 400 and to known compression technologies. Thus, bandwidth efficiency may be increased and to exceed the effective rate limited by known modems.

Using base-band encoding and decoding, side band encoding/decoding, and producing heterodyne conversions, the disclosed embodiments may use compression and tools to allocate information to various sub-bands and frequencies. Encoder 400 may encode this information to allow tagged information to be sent, such as packet voice, video-on-demand data, and the like, in a bundled package inside of microlets, represented by a signal, to reach the correct destination. This feature is transparent to all media.

Layer 412 may include an encoding layer that has a 4-character map with 7-character sublevels that result in all the possible combinations of the 32 states of an electron and its inverse properties to create a character string of 64 bits. The character map may be included in a map function generated by encoding module 402. Any resulting character strings may be mapped to memory 410. This feature may allow for more compression on the look up table or virtual quantum register of memory 410 by identifying course and fine values for each of the above characters. The storage of the differences between the sine samples and the sine waveform should decrease the storage burden on memory 410. Filters also may facilitate transforming data representations into a signal representation in conjunction with encoder 400.

Figure 5:
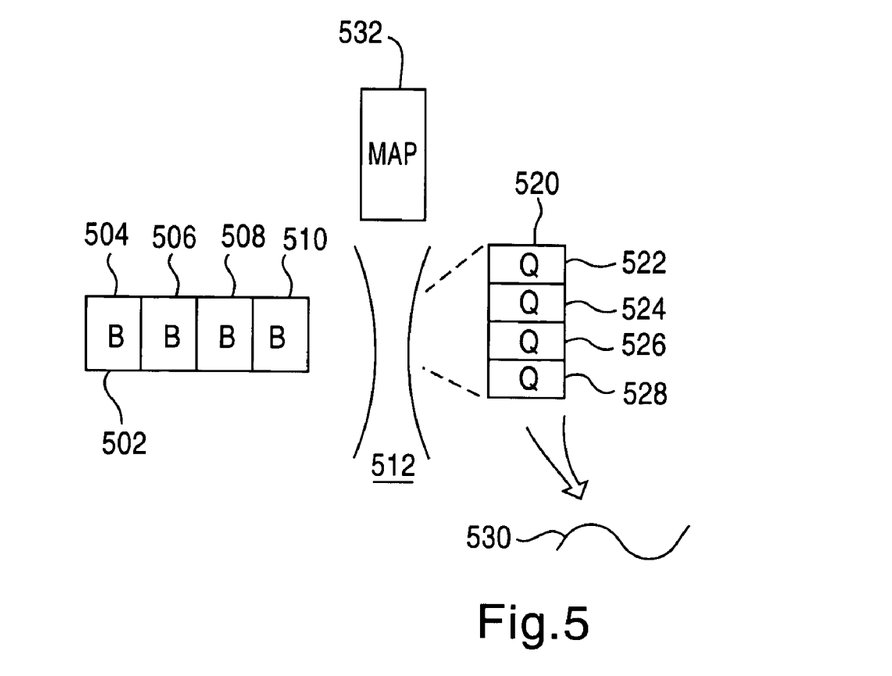
FIG. 5 illustrates a representation of encoding data according to the disclosed embodiments.

FIG. 5 illustrates a block diagram of an encoding process according to the disclosed embodiments. FIG. 5 discloses the encoding process as it might be applicable to FIGS. 1-4. FIGS. 1-4, however, are not limited to the disclosure of FIG. 5. This process may be implemented by encoders, selectors, multiplexers, converters and the like or other components within modems, transmitter/receivers, networks, clients, servers and the like. FIG. 5 includes data block 502, encoding module 512 and encoded signal 530.

As disclosed above, encoding module 512 may use the HB vector space to represent data in encoded signal 530. Information may be a vector that is projected onto data of signal coordinate representations, i.e., axes, by rotation of the axes. For example, in each modulation sequence, phase shifting the vector or wave at integrals of 22.5° and then shifting that wave at either 45° or 15° phase shifts may allow for multiple states within each wave cycle. Further, the information may be compressed into signal character data strands and tagged prior to being interpreted as a sine wave. For example, encoded signal 530 may be output as a sine wave or cosine wave. Encoded signal 530 may have attributes of an analog signal in that it can be transmitted over existing modem and information exchange architectures.

Any applicable operators for a modem implementing the process disclosed with reference to FIG. 5 may be constructed for any given input forms, because any band limited signal, even high-speed optical, may be detailed via a sampling theorem. Matrix operators within encoding module 512, such as map 532, may be viewed as geometric locations of a vector, fixed, and floating point values in a coordinate system. For example, referring to FIG. 5, data block 502 is received by encoding module 512. Map 532 may map data block 502 to the probability states of quantum representation 520. Quantum representation 520 may be an electron state probabilities representation as formed in a bit, or qubit, of data. Map 532 then may serve as a decoding feature or other component that is retained by an applicable system or network to show the representations of the mapped data in its entirety to encoded signal 530.

Thus, information may be thought of as a vector or formula that may apply its informational properties onto any media via rotation of the axis. For example, data block 502 may be rotated by encoding module 512 to generate encoded signal 530. Data block 502 is rotated according to a matrix of mathematical representations to encode data block 502. Data may be modulated into a band limited signal, such as encoded signal 530, using a set of samples into a digital-to-analog conversion module of a base band of a modulator that defines an n-dimensional vector strictly defined in time and bandwidth. These properties pertain to wavelet transforms, and in turn, with microlet transforms. The most common method for creating the wavelet transform includes a quadrature mirror filter. Quadrature mirror filters also may be implemented for microlet transforms. The disclosed embodiments may use an iterated filter bank that produces near perfect results, only allowing for a time delay. This feature may be known as a universal discreet wavelet transform. Filter banks allow for wavelet and microlet transform, said-band coding, multi-resolution analysis and other useful applications.

Thus, according to the disclosed embodiments, any real number may be mapped uniquely into 0 or 1 that then is brought together to comprise encoded signal 530. For example, bit 520 includes uniquely mapped representations of probability states 522, 524, 526 and 528 and may represent the probability states of a quantum representation. These probability states may change even though bit 520 does not.

Computers may use binary numbers such as 1 and 0 to represent numbers. Any bit sequence may be mapped uniquely and precisely to a number by zeros and ones, however, for practical purposes, computers should not represent a number and zeros and ones with an arbitrarily large number. The number of unique bit sequences decreases as the number of bits in a sequence increases comparing to total possible number of unique sequences.

Encoded signal 530 may look to a network like an ordinary bit or data signal. Bit 520 also may be treated by a network like an ordinary bit. When encoded signal 530 and bit 520 is decoded, however, an exact representation of the original information within data block 502 may be produced. For example, all of bits 504, 506, 508 and 510 are regenerated on the receiving end without losing any of the bits from data block 502.

Quantum theory states that everything in nature, including all types of information, may be described by a finite number of information constructs. The disclosed embodiments may use synthetic intelligence, such as rule-based software agents, that are trained for efficient pattern analysis and use a genetic evolutionary method to reduce the number of information constructs to a manageable number, so that the disclosed embodiments may be executed and integrated with known hardware, software, network and the like systems.

Thus, the disclosed embodiments may operate exclusively at the binary level, which increases simplicity and integratability. Encoding information, such as encoded signal 530 may look to the network like ordinary bits to work over an existing network infrastructure. Synthetic intelligent agents may reduce information constructs so encoding, such as that by encoding module 512, is not computationally intensive.

A finite number of states may exist in a quantum representation, such as an electron. The disclosed embodiments may isolate regions within an HB space to determine probabilities of energy levels within these regions. These probability levels of the energies then become the representations of data for information, such as data block 502. The probabilities may be represented in bit 520 as quantum states 522, 524, 526 and 528. These states also may be known as quantum numbers.

The disclosed embodiments may implement microlets that are unique technology blended with quantum mathematics and wavelet technology. The dynamics of filtering and wave shaping may be adjusted or changed as is done in existing wavelet systems. Switching devices may be implemented with the benefits of wavelet mathematics or microlet transforms. These benefits may include canceling noise and interference and bringing the transforms from non-microlet soures. A transport layer within the network may transport microlet transforms such as those within encoded signal 530 over a transmission medium. Microlet transforms may be shown in FIG. 5 as bit 520 having quantum states 522, 524, 526 and 528. Thus, using microlets may retain the unique properties of wavelets to increase transmission capacity and reduce interference with the benefits of multidimensionality shown by representing the probabilities of energy within the quantum representation, such as an electron. The wave may be re-shaped by other components. Unlike wavelets, microlets may not be limited by using transforms, physical interference and two bits per wavelength.

Map 532 may reside in encoding module 512. Map 532 may be a mathematical representation that facilitates encoding data block 502. These mathematical representations may behave according to quantum theory principles even though they are being executed on existing hardware, software or network systems. The mathematical model representations of map 532 may behave according to quantum theory even though they are executing unknown systems. Probabilities, which are rule-defined and software-agent controlled, may be assigned to a set of binary alternatives.

These rule-based software agents may include memory, such that the software agents learn about the environment, and because the software agents are dynamic software agents, and the software program has attributes of actual electrons or quantum behaviors, the software agents may learn, adapt and cooperate within a virtual electron multi-agent environment. The distributed processing of the internal network of virtual agents, such as map 532, may act like a neural net which allows them to build on past experience and new updates. For example, map 532 may be linked to additional maps or encoding modules 512 to develop a neural net that exchanges information experiences and updates.

By applying the rules into an algorithm within encode module 512 that designates the four quantum numbers and their behavior to a mapped model, the disclosed embodiments may be able to generate a single affine transform that represents the embodied information stored in an electron, or quantum representation, in a pseudo-electron environment. A four-dimensional lattice/array is utilized to collect information, and compile binary mapping that is run through a synthetic quantum algorithm within encoding module 512 and the ordinary bits of binary or analog information are transposed into an electron-like setting on bit 520 of encoded signal 306.

Transforms according to the disclosed embodiments may need minimal space such that they can be mapped in a very diverse library code book. Because the encoding occurs in a near-perfect environment and there is a symmetrical relationship, the decoding is the inverse operation of the encoding. The disclosed embodiments normalize individual affine transforms into encoded signal 530 easily by using various processes to minimize data, such as competing conditional probabilities and establishing the hierarchical tracings forwarded into categories backwards to the source. For example, in the case of a high resolution picture going into the library, an algorithm within encoding module 512 may encode the series of n-dimensional arrays. The values of the n-values defined in the former's element grid-points of the hypothetical data set are stored for clarity and to allow interpolations. In order to make such data set self-contained, to facilitate access and to remove the possibility of ambiguity, a raise containing the values of each of the parameters in which that data set the pin are therefore contained alongside the n-dimensional array containing the calibration data set.

Amplitudes of probability state functions may be used to measure the amplitude probability of any given state within the quantum representation, such as an electron, and to calculate the microlet transform. These actions may occur in encoding module 512. In further defining and cataloging these amplitudes or states, it may not be necessary to measure just for each symbol in a real-time environment. After an affine definition is assigned, any of the changes in symbols may be measured and sent, and these will be stored in the virtual quantum register library, as disclosed above. Because by definition these n-bits may be in any super position of both states, the microlet transform, such as bit 520, may fulfill the transform function of the argument. Thus, data block 502 may be encoded or mapped in a lossless manner to encoded signal 530. The disclosed embodiments include mapping data block 502 in a one-to-one fashion onto encoded signal 530. Encoded signal 530 then may be transmitted or exchanged within a network. Encoded signal 530, once received, may be decoded back to data block 502 in its entirety.

The disclosed embodiments also may use fillers in generating encoded signals. To define the filter sub-bands in a modem, the sample-rate dimensionality, and roll-off for the filter banks are selected to match the active sub-bands to the channel bandwidth. The channel bandwidth may be scalable according to the disclosed embodiments. The number of bits per symbol in each coordinate may be scaled to satisfy the signal to noise ratio (SNR) for that sub-band. The best rotation operator may use baseband filter banks. Direct digital frequency synthesizers (DDFS) may take advantage of the quarter-wave symmetry of a sine wave to reduce the ROM storage.

For example, samples from 0 to $\pi/2$ are stored and the second MSB of a phase accumulator may determine the quadrant and may synthesize a sine wave from 0 to $\pi$. This feature is used to synthesize the complete sine wave from 0 to $2\pi$. With a cosine waveform, the zero crossings are advanced by $\pi/2$ with respect to the sine waveform. By using the properties of eighth wave symmetry of sine and cosine waveforms, sample of sine from 0 to $\pi/4$ are the same as samples of cosine from $\pi/4$ to $\pi/2$. Inversely, cosine samples from 0 to $\pi/4$ may be the same as sine from $\pi/4$ to $\pi/2$. Thus, the disclosed embodiments should only store sine and cosine samples from 0 to $\pi/4$. A third MSB may be used to select between these values. In order to align the 8-wave symmetry axis plane of the sine and cosine, the third MSB may be negated via a logic (XOR, AND, and the like) gate and the second MSB may carry the signal modem technology to allow for a baseband minimum of 400 MHz and with optimization of the sub-rate polyphase structure and the ability to run the disclosed embodiments in stacks. Using the disclosed embodiments, it may be a simple effort to run baseband into the GHz.

The need for commuting rotation operators may be satisfied by wavelet theory. The disclosed embodiments may use an iterated filter bank (IFB) that produces perfect results, only allowing for a time delay, and may be known as a universal discrete wavelet transform (UDWT). Integer wavelet and scaling coefficients may result instead of the usual floating point coefficients. FIR filters may be used to construct the filter bank. Although other filters, such as IIR also may be used, the infinite response may lead to an infinite data expansion. Eigenfunctions are a function (x,y,z) within quantum mechanics. The wave function may be a mathematical expression involving the coordinates of a particle in space. If an equation can be solved for a particle in a given system, such as an electron in an atom, depending on the boundary conditions, the solution may be a set of allowed wave functions, or eigenfunctions, of the particle, with each corresponding to an allowed energy level, or eigenvalue. The physical significance of the wave function is that the square of its absolute value at a certain point if proportional to the probability of finding the particle in a small element of volume at that point. For an electron in an atom, this feature forms the idea of atomic and molecular orbitals.

Filter banks may allow for wavelet and microlet transforms with sub-band coding, multiresolution analysis, and other useful applications. Referring to a one-stage filter bank, a one stage wavelet may use two analysis filters, a low and high filter followed by subsampling for the forward transform. It seems logical to construct the inverse transform by first performing an up-sampling step and to use two filters in low and high pass to reconstruct the signal. The disclosed embodiments may use filters here, because the up-sampling step is performed by inserting a 0 between every two samples and the filters may have to smooth this operation. For the filter bank disclosed, the conditions for a perfect reconstruction are met. The time reversion of the analyzing filters may be required to compensate for the delays in the filters. Without this feature, the disclosed embodiments may not arrive at a non-delayed, perfectly reconstructed signal. If the conditions are fulfilled for perfect reconstruction, then all the aliasing caused by the subsampling may be cancelled in the reconstruction.

The disclosed embodiments may use reconstructed FIR filter mathematics to produce a polyphase matrix. By finding an invertable wavelet transform, the process of using FIR filters may amount to finding a matrix P(z) with a determinant of 1. Four filters may be used from the invertable wavelet transform and are purely mathematical. The results of the mathematical steps are fewer and computationally faster, as well as perfect, or lossless. All of the samples in a stream are replaced by new samples and at any time, only the current streams are needed to update sample values. This features allows the whole transform to be done in-place, with no requirement for auxiliary memory. This feature may be similar to FFT and QMF without the complex computation and waste and produces a perfect transform as opposed to a near perfect transform.

For long filters, a lifting scheme may cut the computational complexity in half, when compared to the standard iterated FIR filter bank algorithm. A wavelet may have a complexity of N making it more efficient than FFT with Nlog(N) and lifting increases speed by another factor of 2. Additional benefits of the iterated scheme may be easy invertability of any transform, in-place calculations of the transforms, and simple integer transform coefficients without losing any features of wavelet transforms. Additionally, the disclosed embodiments may change the polyphase representation formula to represent a digital equivalent of Euler's formula.

Filters used with the disclosed embodiments may have a rotation similar to the near perfect rotation in QMFs. The disclosed embodiments may achieve a better result with parallel decomposition or scalable lattice filter designs within the FIR filters. In the disclosed embodiments, the disclosed framework may be given added dimensionality and complexity with the addition of the complex FIR filter designs and the splitting of the input waveform into four distinct "sub-bands." This feature may be utilized in a number of ways. It may be used to further detail a single strand of information, or used to simultaneously transform and compute two separate waveforms. A phase accumulator has a carry propagate adder with a character length necessary to produce the final addressing for ROM and QRV look up. A conditional sum adder with a 64 bit carry propagate adder may suffice without impacting the clock distribution network.

Each overflow represents a value of a sine wave. The input character, or frequency control character, may correlate to the phase accumulator to control the frequency of the generated sine waveform. The QRV, or virtual quantum register, may act as a sine generator and ROM look up table that stores the character and wave representations. Frequency resolution may be doubled by each of the 1 bit to phase accumulator characters. Another possible advantage of the disclosed embodiments may be the capability to switch between 2 frequencies in 1 clock cycle. Using a register with dynamic positive edge-triggered single phase register for and a minimum sized inverter for switching noise may cancel out clock skew and power supply switching noise. Additional on-chip thin-oxide decoupling capacitors on power/ground lines and on-chip power supplies may be isolated from off-chip power supplies. A synthesizer may provide quadrature outputs without increasing the size of the look up table, or QRV.

The disclosed embodiments may provide phase modulation, quadrature amplitude modulation with full complex multiplications for single and double sideband frequency translations. This feature may allow for a tunable QAM modulator using square-root FIR filters for pulse shaping and removing in-band images as well as increasing the sampling rates.

Modems according to the disclosed embodiments may be well suited for existing telephone networks, wireless and larger bandwidth infrastructures. It may be possible to achieve multi-dimensional lossless transforms in suitable numbers, such as 4, 8, 13, 16, 24 and the like. In multiresolution analysis, additional pairs of FIR may be placed in the low pass branches of the first FIR, and then additional FIRs in the following, and so forth. This configuration may result in a canonical form. The input signal may be projected onto the orthogonal basis functions by the filters. Because the lifting scheme does the down sampling prior to this step, the rate may be halved, quartered, or selective depending on the need. A multi-resolution analysis also may be performed in the high pass branches resulting in all of the sub-bands having the same rate. This feature may allow for equal any-dimensional lossless flips to be achieved.

Incoming signals may be divided by an analyzer into two high pass and two low pass branches. The down sampling may be performed prior with the lifting scheme so this features may save the need for computation of down sampling by 2 and discarding every other sample. At this stage, 4 input samples (x, $x^2$ and y, $y^2$) may be transformed into 4 bandlimited samples. The sequences of (x, $x^2$ and y, $y^2$) and the bandlimited samples may both define in vector spaces of the same dimensions because of the lifiting scheme. The subbands may not have to be equal as long as the information in the input is accounted for in the lifting scheme of the residual function. A synthesizer may perform the exact same operation in reverse with the lifting scheme to form the reconstructed signal samples. By using filters to obey the equations of a geometric 4 dimensional rotation, the reconstructed samples may match perfectly the input signal with the required time delay for perfect reconstruction. Using finite impulse response filters (FIR) may yield filter coefficients that turn out to be samples of orthogonal functions. This feature may produce other instances like bi-orthogonal coefficients and the like if the filters desire it. This also may give a perfect match without a round off error generated by QMF or IIR filters.

One having ordinary skill in the art will understand that the invention, as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims and their equivalents.

I claim:

1. A method for encoding data, the method comprising:
   determining a probability state of a quantum representation;
   encoding a set of bits with the probability state of the quantum representation; and
   encoding a set of bits with the probability state of the quantum representation;
   wherein said determining step comprises determining the probability state of said quantum representation, and wherein said quantum representation is an electron, method further comprising forming said electron as a virtual electron to represent said set of bits.

2. A method for encoding data, the method comprising:
   determining a probability state of a quantum representation;
   encoding a set of bits with the probability state of the quantum representation; and
   generating a microlet transform from said set of bits.

3. A method for encoding data, the method comprising:
   determining a probability state of a quantum representation;
   encoding a set of bits with the probability state of the quantum representation; and generating an encoded set of bits representing the set of bits.

4. A method for encoding data, the method comprising:
   determining a probability state of a quantum representation;
   encoding a set of bits with the probability state of the quantum representation; and
   generating an encoded set of bits representing the set of bits, wherein the encoded set of bits is smaller than the set of bits.

5. A method for encoding data, the method comprising:
   determining a probability state of a quantum representation;
   encoding a set of bits with the probability state of the quantum representation; and
   generating an encoded set of bits representing the set of bits, wherein the encoded set of bits comprises a single bit.

6. A method for encoding data, the method comprising;
   determining a probability state of a quantum representative; encoding a set of bits with the probability state of the quantum representation;
   and generating a signal comprising the quantum representation.

7. A method for encoding data, the method comprising:
   determining a probability state of a quantum representation;
   encoding a set of bits with the probability state of the quantum representation;
   filtering the signal; and
   generating a signal comprising the quantum representation.

8. The method of claim 7, wherein the filtering comprises shaping the signal to a waveform.

9. A method for encoding data, the method comprising;
   determining a probability state of a quantum representation;
   encoding a set of bits with the probability state of the quantum representation;
   and generating a qubit, wherein said qubit comprises the quantum representation of the set of bits.

10. A method for encoding data, the method comprising:
    determining a probability state of a quantum representation;
    encoding a set of bits with the probability state of the quantum representation;
    generating a qubit, wherein said qtibit comprises the quantum representation of the set of bits, and
    transforming the qubit into a signal.

11. The method of claim 10, wherein said transforming comprises transforming the qubit into a microlet, and where said microlet comprises said signal.

* * * * *